(12) United States Patent
Ding et al.

(10) Patent No.: US 12,418,106 B2
(45) Date of Patent: Sep. 16, 2025

(54) FLEXIBLE CONNECTOR WITH PERMEABILITY SHIELD TO REDUCE ANTENNA LOSS

(71) Applicant: Google LLC, Mountain View, CA (US)

(72) Inventors: Yao Ding, San Jose, CA (US); Qi Qi, San Jose, CA (US)

(73) Assignee: Google LLC, Mountain View, CA (US)

( * ) Notice: Subject to any disclaimer, the term of this patent is extended or adjusted under 35 U.S.C. 154(b) by 110 days.

(21) Appl. No.: 18/525,735

(22) Filed: Nov. 30, 2023

(65) Prior Publication Data

US 2024/0097321 A1 Mar. 21, 2024

Related U.S. Application Data

(60) Provisional application No. 63/602,971, filed on Nov. 27, 2023.

(51) Int. Cl.
*H01Q 1/52* (2006.01)
*H01Q 1/50* (2006.01)
*H05K 1/02* (2006.01)

(52) U.S. Cl.
CPC .............. *H01Q 1/526* (2013.01); *H01Q 1/50* (2013.01); *H05K 1/0216* (2013.01); *H05K 2201/0715* (2013.01); *H05K 2201/10098* (2013.01)

(58) Field of Classification Search
CPC ...... H01Q 1/24; H01Q 1/50–52; H01Q 1/273; H05K 1/0216; H05K 2201/0707; H05K 2201/10098
See application file for complete search history.

(56) References Cited

U.S. PATENT DOCUMENTS 6,861,989 B2 * 3/2005 Morningstar .......... H01Q 1/243
343/702
11,594,824 B2 * 2/2023 Zegarra ................ H01Q 1/2283
(Continued)

FOREIGN PATENT DOCUMENTS

| KR | 102305912 | 9/2021 |
|---|---|---|
| WO | 2016173500 | 11/2016 |

OTHER PUBLICATIONS

Li, Tianqi, "Radio frequency interference (RFI) modeling of complex modules in mobile devices and system-level modeling for transient ESD simulation", Doctoral Dissertations. 2346. https://scholarsmine.mst.edu/doctoral_dissertations/2346, Sep. 2014, 97 pages.

*Primary Examiner* — Hasan Islam
(74) *Attorney, Agent, or Firm* — Colby Nipper PLLC

(57) ABSTRACT

This document describes apparatuses and techniques for providing a flexible connector between a secondary circuit board and a main logic board with a permeability shield to increase impedance of the flexible connector to reduce antenna loss from an antenna via the flexible connector to the main logic board. For example, an apparatus includes a secondary circuit board supporting one or more control pads and an antenna. A flexible connector includes a plurality of conductive traces configured to electrically couple the one or more control pads of the secondary circuit board to a coupling on a main logic board. A permeability shield is configured to be disposed along one or more portions of the flexible connector. The permeability shield is configured to increase impedance of the flexible connector to reduce antenna loss of the antenna via the control pads and the flexible connector to the main logic board.

7 Claims, 6 Drawing Sheets

(56) References Cited

U.S. PATENT DOCUMENTS

| | | |
|---|---|---|
| 2009/0213565 A1 | 8/2009 | Booth et al. |
| 2012/0228019 A1 | 9/2012 | Ermolov et al. |
| 2020/0413527 A1 | 12/2020 | Chien et al. |
| 2023/0282962 A1 * | 9/2023 | Wei ....................... H01Q 13/10 343/700 R |

* cited by examiner

700

Selecting a permeability shield material configured to increase impedance of a flexible connector of a secondary circuit board to antenna signals of an antenna disposed on the secondary circuit board
702

Forming one or more sections of the permeability shield to be disposed on one or more portions of the flexible connector
704

Attaching the one or more sections of the permeability shield to the one or more portions of the flexible connector
706

*FIG. 7*

FLEXIBLE CONNECTOR WITH PERMEABILITY SHIELD TO REDUCE ANTENNA LOSS

CROSS-REFERENCE TO RELATED APPLICATION(S)

This application claims the benefit of U.S. Provisional Patent Application Ser. No. 63/602,971 filed on Nov. 27, 2023, the disclosures of which are incorporated by reference herein in their entireties.

SUMMARY

This document describes apparatuses and techniques for providing a flexible connector between a secondary circuit board and a main logic board with a permeability shield to increase impedance of the flexible connector to reduce antenna loss from an antenna via the flexible connector to the main logic board.

For example, an apparatus includes a secondary circuit board supporting one or more control pads and an antenna. A flexible connector includes a plurality of conductive traces configured to electrically couple the one or more control pads of the secondary circuit board to a coupling on a main logic board. A permeability shield is configured to be disposed along one or more portions of the flexible connector. The permeability shield is configured to increase impedance of the flexible connector to reduce antenna loss of the antenna via the control pads and the flexible connector to the main logic board.

This Summary is provided to introduce apparatuses and techniques for providing a flexible connector between a secondary circuit board and a main logic board with a permeability shield to increase impedance of the flexible connector to reduce antenna loss from the antenna via the flexible connector to the main logic board, as further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of apparatuses and techniques for providing a flexible connector between a secondary circuit board and a main logic board with a permeability shield to increase impedance of the flexible connector to reduce antenna loss from the antenna via the flexible connector to the main logic board are described in this document with reference to the following drawings. The same numbers are used throughout the drawings to reference like features and components:

FIG. 7 is a flow diagram of an example method of installing a permeability shield on the flexible connector of FIG. 1.

DETAILED DESCRIPTION

Overview

Figure 1:
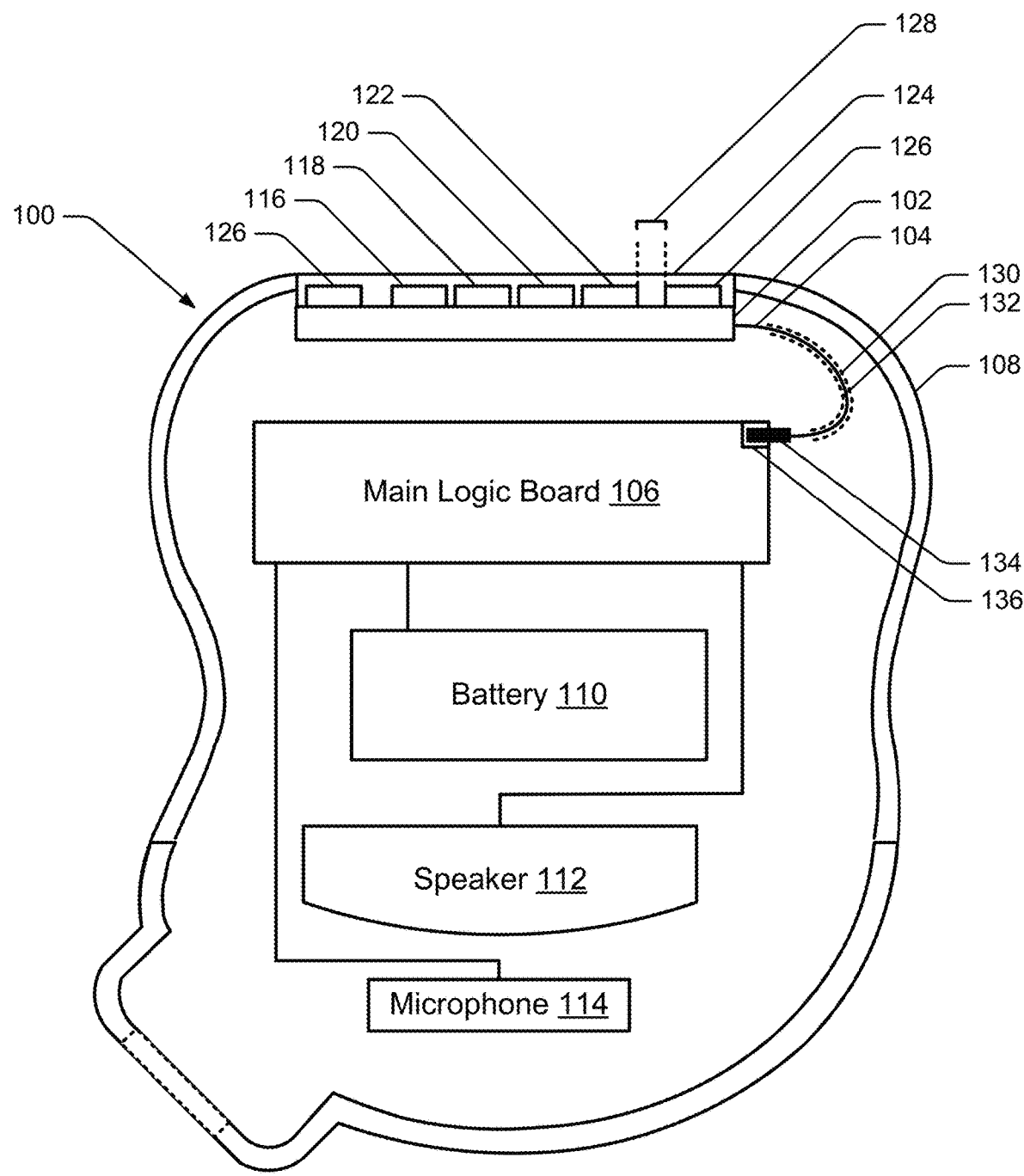
FIG. 1 is a cutaway diagram of an electronic device incorporating a secondary circuit board with control pads and an antenna coupled with a main logic board via a flexible connector equipped with a permeability shield.

Many electronic devices incorporate secondary circuit boards, which support control pads or other devices, that are coupled by a flexible connector to a main logic board. In devices with communications capabilities, such as earbuds, camera doorbells, and similar devices, the secondary circuit board also may include a Bluetooth® or a Wi-Fi™ antenna to facilitate communication of the device with an external device.

In compact electronic devices, a problem may arise with having an antenna disposed on the secondary circuit board in close proximity with control pads or other components that communicate via the flexible connector with the main logic board. For example, when an antenna is in close proximity with the control pads, it may result in antenna loss caused by a portion of the antenna signals being diverted to the main logic board through conductive traces for the control pads. In some devices, impedance chokes are disposed on the main logic board to isolate the main logic board from the antenna signals. The impedance chokes operate as low-pass filters to allow the flow of intended signals along the conductive traces and other signal lines while seeking to isolate the main logic board from high-frequency antenna signals, such as Bluetooth® or a Wi-Fi™ signals. Because the high-frequency antenna signals are blocked from flowing to the main logic board, antenna loss is reduced.

However, the use of impedance chokes adds to the cost of the device, both in terms of the cost of the components and the cost of installing the impedance chokes. Furthermore, installation chokes take up space, which may be at a premium in any electronic device and particularly so in a compact device such as an earbud. It may be difficult to find room on the main logic board to include impedance chokes and even more difficult to include such devices on the secondary logic board. Another way to isolate the main logic board from antenna signals to reduce or avoid antenna loss is needed.

This document describes apparatuses and techniques for providing a flexible connector between a secondary circuit board and a main logic board with a permeability shield to increase impedance of the flexible connector to reduce antenna loss from an antenna via the flexible connector to the main logic board. In implementations, a permeability shield is disposed on one or more portions of the flexible connector. The permeability shield may be a section of an electromagnetic compatibility suppression film, such as a polyimide film incorporating a high permeability material to have a high relative permeability. The addition of the permeability shield increases the impedance of the conductor to antenna signals, thereby preventing antenna loss.

For example, an apparatus includes a secondary circuit board supporting one or more control pads and an antenna. A flexible connector includes a plurality of conductive traces configured to electrically couple the one or more control pads of the secondary circuit board to a coupling on a main logic board. A permeability shield is configured to be disposed along one or more portions of the flexible connector. The permeability shield is configured to increase impedance of the flexible connector to reduce antenna loss from the antenna via the control pads and the flexible connector to the main logic board.

Example Device Including a Flexible Connector with a Permeability Shield

FIG. 1 is a cross-sectional view of an earbud 100. The earbud 100 includes a secondary circuit board 102 joined by a flexible connector 104 to a main logic board 106. A housing 108 of the earbud 100 accommodates the secondary circuit board 102, the flexible connector 104, and the main logic board 106, as well as a battery 110, a speaker 112, and a microphone 114. Functions of the earbud 100 may be controlled by contact pads 116, 118, 120, and 122 on the secondary circuit board 102. Specifically, the functions of the earbud may be controlled by a user tapping or swiping a touch pad 124 positioned over one or more contact pads 116, 118, 120, or 122 to initiate desired functions.

As previously described, the secondary circuit board 102 also supports an antenna 126 that supports Bluetooth® or a Wi-Fi™ connectivity with a mobile telephone, computer, audio player, television, or other audio device. As a consequence of the small size of the earbud 100, the antenna 126 may be separated from the control pads 116, 118, 120, and 122 by only a small displacement 128. The small displacement 128, as previously described, is part of the reason that antenna loss between the antenna 126 and the control pads 116, 118, 120, and 122 is an issue for which impedance chokes (not shown) are desirable to increase the impedance of the flexible connector 104 to at least partially block high-frequency signals at the antenna 126 from leaching to main logic board 106 via the contact pads 116, 118, 120, and 122 and the flexible connector 104.

To increase the impedance of the flexible connector 104, one or more permeability shields 130 and 132 (represented in dotted lines in FIG. 1) are disposed on one or more portions of the flexible connector 104. The permeability shields 130 and 132 at least partially block the high-frequency signals received or transmitted by the antenna 126 from being leached by the contact pads 116, 118, 120, and 122 through the flexible connector 104 to a lug 134 at the end of the flexible connector 104 that is received by a coupling 136 on the main logic board 106. Although a lug 134 is shown in the example of FIG. 1, it will be understood that the flexible connector 104 may be a ribbon connector or other connector with a thin terminus receivable by zero-insertion-force connector or similar coupling.

Examples of Permeability Shields Disposed on a Flexible Connector

Figure 2:
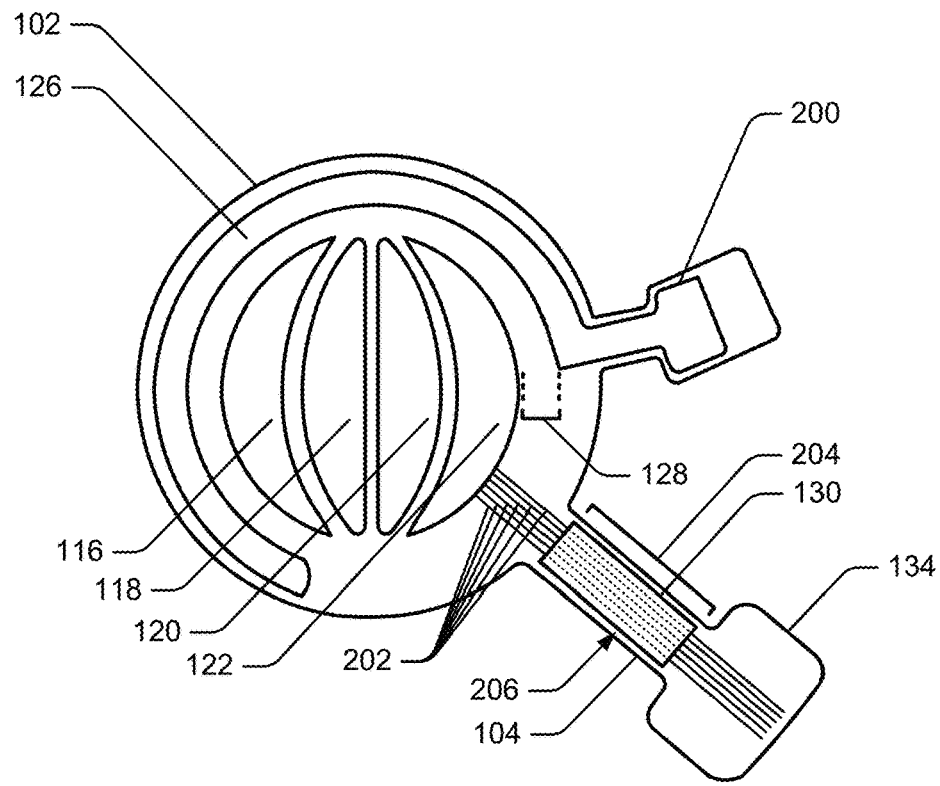
FIG. 2 is schematic diagram of the secondary circuit board and the flexible connector of FIG. 1 with the permeability shield disposed on a portion of the flexible connector.

FIG. 2 is schematic diagram of the secondary circuit board 102 and the flexible connector 104 supporting the permeability shield 130 as shown in FIG. 1. In implementations, the antenna 126 is concentrically situated around or partially around the control pads 116, 118, 120, and 122. As previously described, the antenna 126 is separated from the control pads 116, 118, 120, and 122 by only a small displacement 128. The antenna 126 may include an antenna connector 200 that is separate from the flexible connector 104 in an attempt to prevent signal leakage to conductive traces 202 of the flexible connector 104 for the control pads 116, 118, 120, and 122. Despite separating the antenna connector 200 from the flexible connector 104, the small displacement 128 between the antenna 126 and the control pads 116, 118, 120, and 122 still permits antenna loss from the antenna 126 via the conductive traces 202 of the flexible connector 104 to the main logic board 106 (not shown in FIG. 2).

In the example of FIG. 2, the permeability shield 130 is disposed along a portion 204 of the flexible connector 104. The portion of the permeability shield 130 shown in FIG. 2 is disposed on a first surface 206 of the generally flat body of the flexible connector 104. As further described below, a second permeability shield 132 also may disposed on a second surface (neither of which is shown in FIG. 2) of the flexible connector 104 that is on a surface of the flexible connector 104 opposite to the first surface 206 instead of or in addition to the permeability shield 130 disposed on the first surface 206 of the flexible connector 104. The portion 204 of the flexible connector 104 covered by the permeability shield 130 may be longer or shorter than the portion 204 of FIG. 2, which may be constrained by the structure of the device in which the flexible connector 104 is installed, as also further described below.

Figure 3A:
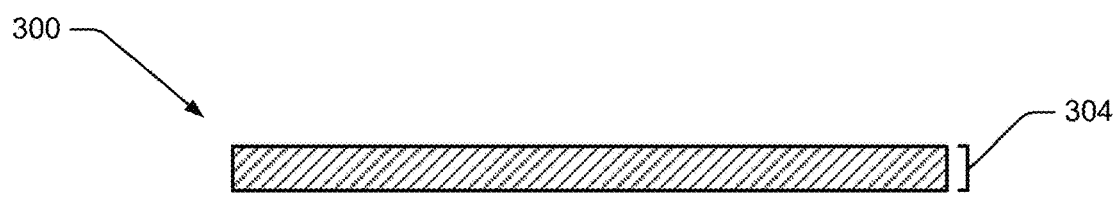
FIGS. 3A and 3B are side views of electromagnetic compatibility suppression films that may be used in the permeability shield of FIG. 1.
Figure 3B:
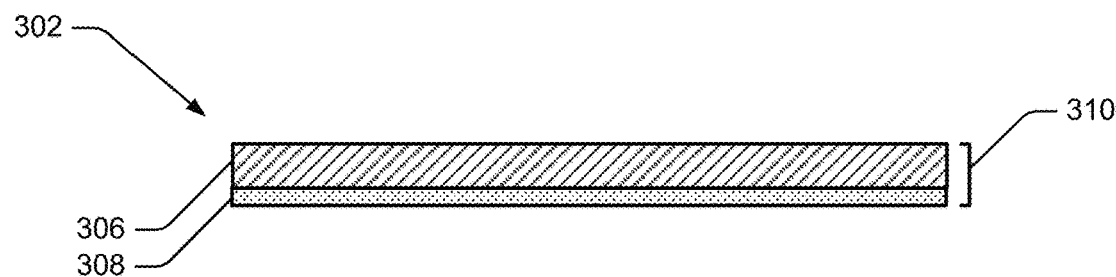

FIGS. 3A and 3B are side views of electromagnetic compatibility (EMC) suppression films 300 and 302, respectively, that may be used in creating permeability shields such as the permeability shield 130 of FIGS. 1 and 2. EMC suppression sheets or films block or limit unwanted emissions. In embodiments, the EMC suppression films 300 and 302 include polyimide films, such as Kapton® films or tapes, that incorporate a high permeability material. The high permeability material may be a ferromagnetic material or another high permeability material that is layered on a polyimide film or tape or otherwise incorporated within the polyimide film or tape. In implementations, the high permeability material should be applied so that the permeability shield has a relative permeability greater than or equal to 1.0 to provide a desirable degree of shielding to resist induction of magnetic flux at high frequencies such as Bluetooth® or a Wi-Fi™ frequencies to prevent against antenna loss. Polyimides are a polymer that are appreciated for being lightweight, flexible, and resistant to heat and chemicals and thus provide a suitable body for a permeability shield. Thus, analogous in function to the inductance chokes (as previously described), application of a polyimide films or other EMC suppression films may be used to isolate the main logic board 106 from the antenna 126 to help prevent antenna loss.

As previously described, inductance chokes are rigid structures that have a considerable size as well as a considerable cost to acquire and install. It may be difficult to allow room on the main logic board 106 to install inductance chokes and may be impractical or difficult to include inductance chokes on the secondary circuit board 102 or the flexible connector 104. However, polyimide films or other EMC suppression films are flexible and, even at a small thickness, because of their magnetic permeability to high-frequency signals, may be used to isolate the main logic board from antenna signals while adding little bulk or weight. As further described below, the polyimide films or other EMC suppression films may be sized or shaped to fit available space in an apparatus like the earbud 100 while helping to isolate the main logic board 106 from the antenna signals.

Referring again to FIG. 3A, the EMC suppression film 300 has a small thickness 304. Commercially-available EMC suppression films are available in different gauges ranging in thickness, for example, from 25 microns to 125 microns (about 1 to 5 mils). Increasing the thickness 304, while consuming a small additional amount of space, does further increase permeability. The EMC suppression film 300 may be cut to desired widths and lengths for placement on the flexible connector 104, as described further below, for adhesive or other attachment to the flexible connector 104. The EMC suppression film 302 of FIG. 3B is a self-adhesive film having a film layer 306 and an adhesive layer 308 having a combined thickness 310 that is only slightly greater than the thickness 304 of the EMC suppression film 300 of FIG. 3A while avoiding the need to add adhesive or use another method to attach the EMC suppression film 302 to the flexible connector 104. The self-adhesive EMC suppression film 302 may include Kapton® tape, which is commercially-available and relatively inexpensive. Either of the EMC suppression films 300 and 302 may be cut to size to form permeability shields, such as the permeability shield 130 of FIG. 1 or 2.

Figure 4A:
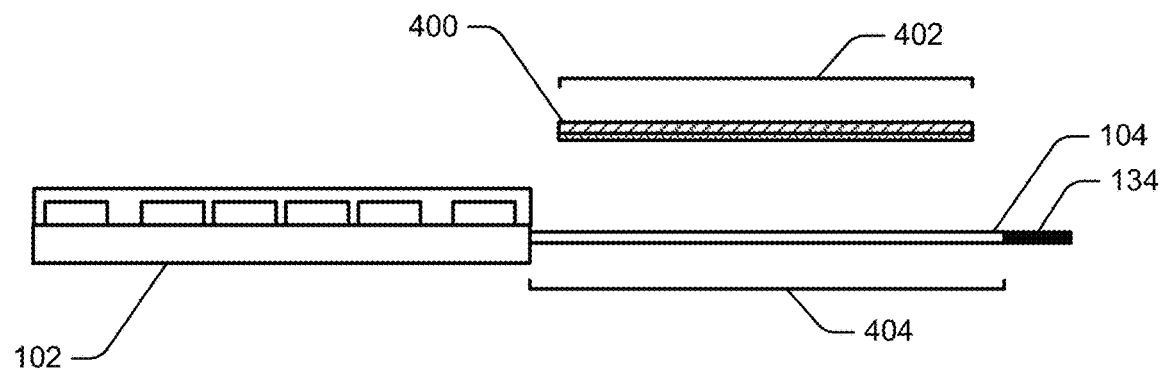
FIGS. 4A-4C are cross-sectional views of the permeability shield being installed on the flexible connector of FIGS. 1 and 2.
Figure 4B:
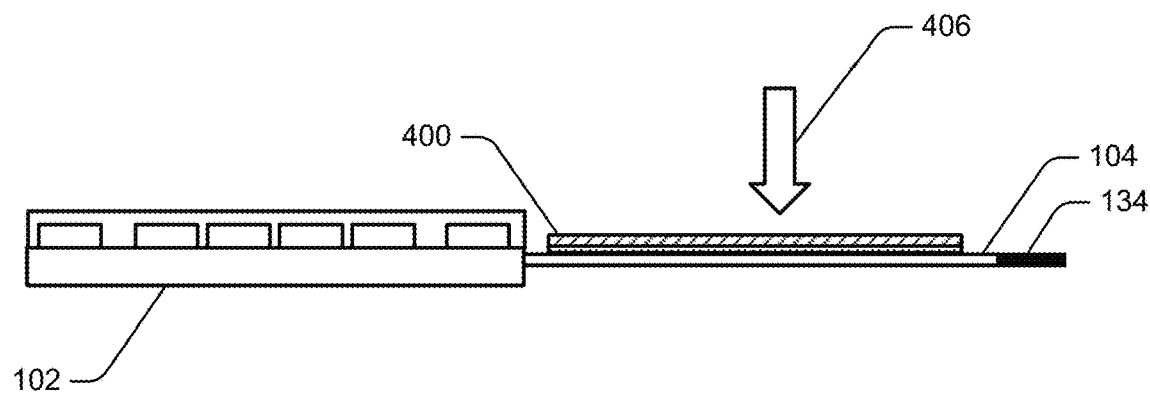
Figure 4C:
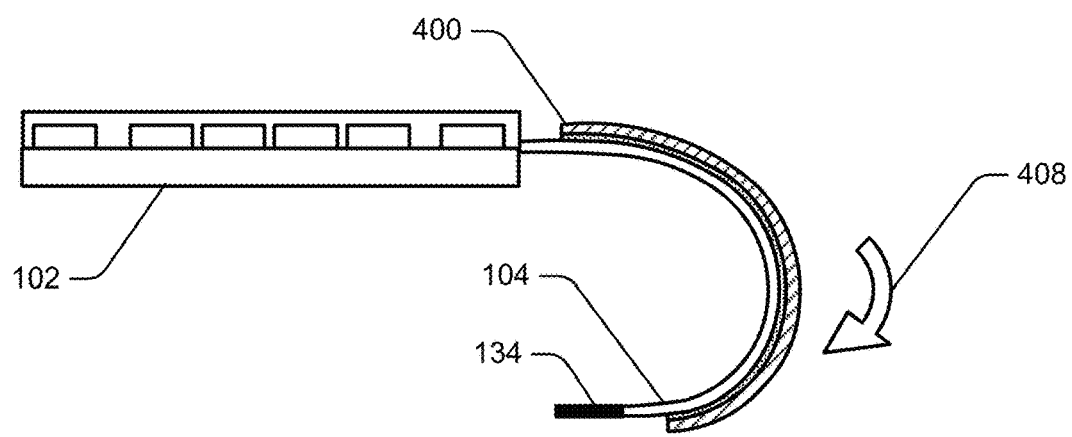

FIGS. 4A-4C are cross-sectional views of a permeability shield 400 being installed on the flexible connector of FIGS. 1 and 2. Specifically, FIGS. 4A-4C depict installation of a piece of the self-adhesive EMC suppression film 302 to form a self-adhesive permeability shield 400. FIG. 4A shows the permeability shield 400 prior to installation, the permeability shield including a strip of the self-adhesive EMC suppression film 302 cut to a length 402 to fit within a length 404 of the flexible connector 104 short of the lug 134. Although not shown in FIG. 4A, a width of the permeability shield 400 may be sized to fit within a width of the flexible connector 104, as shown in FIG. 2.

FIG. 4B shows the permeability shield 400 installed in place by moving the permeability shield through a distance and pressed into place in a direction 406 to adhere the permeability shield 400 to the flexible connector 104. If a self-adhesive EMC suppression film, such as the EMC suppression film 300 of FIG. 3A, an additional adhesive may be applied to the flexible connector 104 to a non-adhesive permeability shield to attach it to the flexible connector 104, or the permeability shield may be installed on the flexible connector 104 with mechanical or other measures.

FIG. 4C shows the combined assembly of the secondary circuit board 102, the flexible connector 104, and the permeability shield 400 for installation, such as in the earbud 100 (FIG. 1). Because of the flexibility of the permeability shield 400, the flexible connector 104 and the installed permeability shield 400 can be twisted or curled in a direction 408 to enable coupling of the lug 134 to the main logic board 106 as shown in FIG. 1 to complete installation of the secondary circuit board 102. Even in a small apparatus such as the earbud 100, the small thickness of the permeability shield 400 allows for accommodation of the permeability shield 400 while gaining the benefit of preventing antenna loss without adding inductive chokes or other space- or cost-intensive isolation devices.

FIGS. 5A-5D are cross-sectional views of alternative configurations of permeability shields disposed on the flexible connector of FIGS. 1 and 2. The permeability shield may be sized to fit within a particular device or apparatus. At the same time, the size of the permeability shield may be selected to provide an enhanced degree of isolation from antenna loss. As will be appreciated, including a larger body of EMC suppression film provides greater isolation, analogous to how increasing a number of windings of an inductor increases its resistance to high-frequency signals. Space constraints and antenna loss considerations may be balanced in different applications.

Figure 5A:
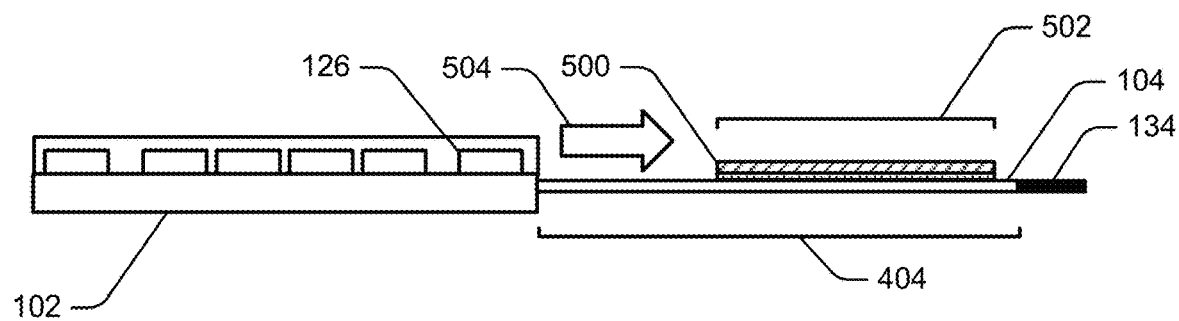
FIGS. 5A-5D are cross-sectional views of alternative configurations of permeability shields disposed on the flexible connector of FIGS. 1 and 2.

FIG. 5A shows a permeability shield 500 having width 502 that is substantially less than the length 404 of the flexible connector 104. The permeability shield 500 is also situated at a displacement 504 from the secondary circuit board 102 which may enable the permeability shield 500 to fit within a particular installation without impinging upon other components. Although the permeability shield 500 is displaced further from the antenna 126 than, for example, the permeability shield 400 of FIGS. 4A-4C, the permeability shield 500 still provides isolation of antenna signals. Reduced size of the permeability shield 500 may provide less isolation than the relatively larger permeability shield 400 of FIGS. 4A-4C, but still may provide isolation to reduce antenna loss while still fitting within space constraints, as described further below.

Figure 5B:
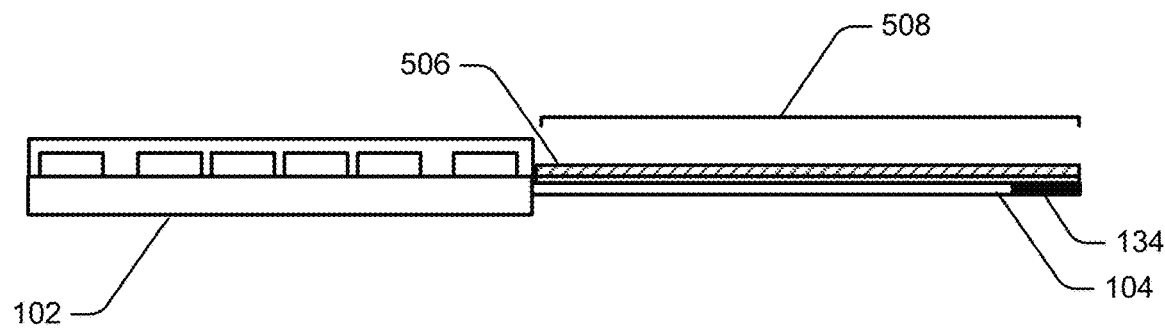

By contrast, FIG. 5B shows a larger permeability shield 506 having a length 508 that fully extends from the secondary circuit board 102 to an end of the lug 134. If space permits for the permeability shield 506 to extend from the secondary circuit board 102 to and end of the lug 134, the permeability shield 506 may provide for greater isolation to prevent antenna loss than if the permeability shield 506 were not extend to the end of the lug 134.

Figure 5C:
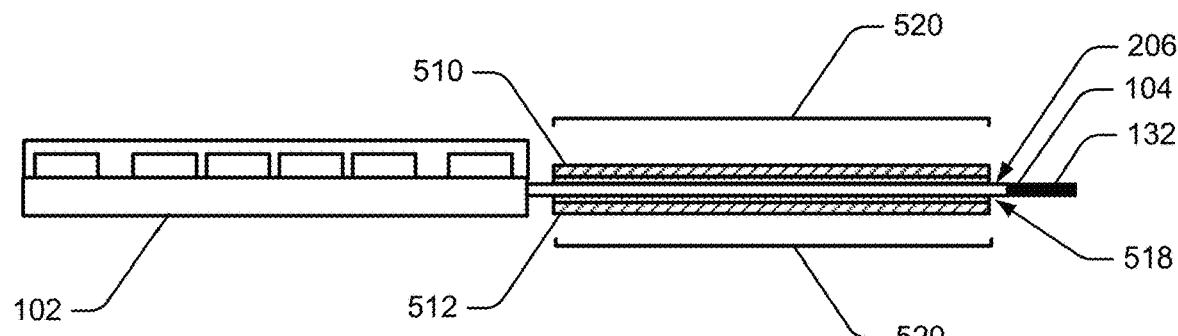
Figure 5D:
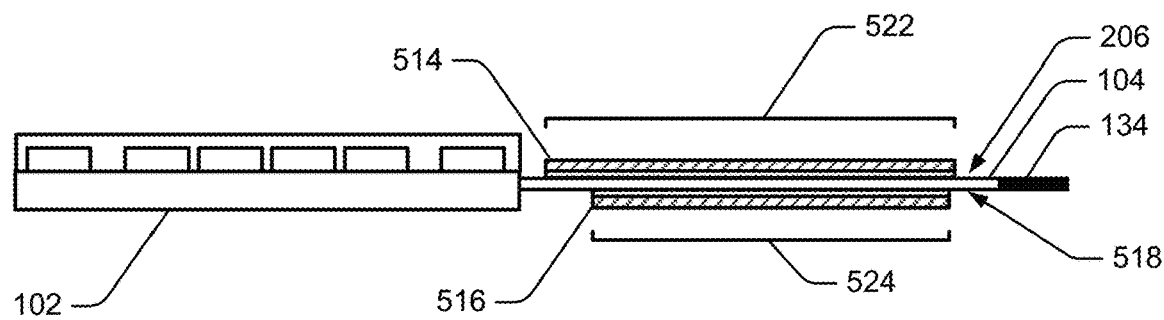

To provide greater isolation from antenna loss, FIGS. 5C and 5D show configurations including pairs of permeability shields 510 and 512 and 514 and 516, respectively, installed on opposing surfaces 206 and 518 of the flexible connector 104. As described with reference to FIG. 2, the flexible connector 104 may include the first surface 206 and an opposite second surface 518. Space permitting, applying the permeability shields 510 and 512 to both the first surface 206 and the second surface 518, respectively, may provide further isolation to reduce antenna loss. The permeability shields 510 and 512 may have an equal length 520, as shown in FIG. 5C. Alternatively, as shown in FIG. 5D, to fit space constraints, the permeability shield 514 disposed on the first surface 206 of the flexible connector 104 may have a length 522 that is different from a length 524 of the permeability shield 516 disposed on the second surface 518 of the flexible connector 104. Again, space considerations and desired isolation may be balanced to determine size and placement of permeability shields.

Figure 6:
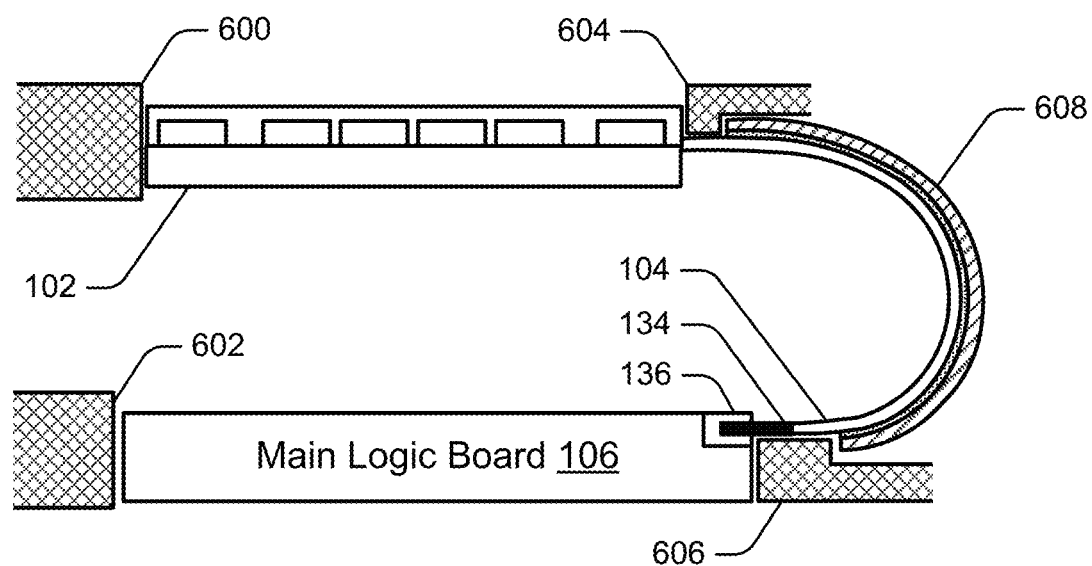
FIG. 6 is a cross-sectional view of a permeability shield configured to accommodate space constraints of a particular apparatus.

FIG. 6 illustrates an examples of space constraints that may affect the selection and placement of permeability shields. A housing 108 (see FIG. 1) of the earbud 100 or another apparatus may include sections 600, 602, 604, and 606 that may abut the secondary circuit board 102, the flexible connector 104, and the main logic board 106. The housing 108 may have been designed without consideration for space for permeability shields as described herein. The permeability shields may be very thin and, thus, may be installed without interfering with installation within the housing 108. On the other hand, where space considerations would prevent permeability shields from being installed in particular locations, the permeability shields may be cut or sized to accommodate installation considerations.

For example, section 604 may directly abut the secondary circuit board and the flexible connector 104 to provide a friction fit for the secondary circuit board 102. To fit this space, a permeability shield 608 may be sized and installed on the flexible connector 104 so that the permeability shield does not extend into a range where it would abut the section 604. Similarly, the permeability shield 608 also may be sized and installed so that it does not abut or interfere with the section 606 adjacent to the main logic board 106 where the lug 134 at the end of the flexible connector 104 is inserted into or otherwise joined with the coupling 136 on the main logic board 106. Again, although the thin materials used in the permeability shields described herein may not create space considerations with regard to the apparatus in which they are used; however, the thin, flexible nature of the EMC suppression films 300 and 302 (FIGS. 3A and 3B) used to form permeability shields may be easily sized and placed to avoid conflicts with other structures in an apparatus.

Example Method of Installing a Permeability Shield

FIG. 7 illustrates an example method 700 of installing a permeability shield on a flexible connector 104 as described with reference to FIGS. 1-6. At a block 702, a permeability shield material configured to increase impedance of a flexible connector 104 of a secondary circuit board 102 to antenna signals of an antenna 126 disposed on the secondary circuit board 102 is selected. The permeability shield material may include one of the EMC suppression materials 300 and 302 (FIGS. 3A and 3B) to provide desired isolation to block antenna signals. At a block 704, one or more sections of the permeability shield material are formed to be disposed on one or more sections of the flexible connector 104. The sections formed may be like any of the permeability shields 130 and 132 (FIG. 1), 400 (FIGS. 4A-4C), 500, 506, 510, 512, 514, and 516 (FIGS. 5A-5D), and 608 (FIG. 6) to provide desired isolation to block antenna signals and to suit space considerations of the apparatus in which the permeability shield will be installed. At a block 706, the one or more sections of the permeability shield are attached to the one or more portions of the flexible connector 104. When the permeability shield is formed of the self-adhesive EMC suppression film 302 of FIG. 3B, the permeability shield may be pressed into place on the flexible connector 104 as described with reference to FIG. 4B. Alternatively, the permeability shield may be attached with a separate adhesive or using another mechanical process.

This document describes apparatuses and techniques for providing a flexible connector between a secondary circuit board and a main logic board with a permeability shield to increase impedance of the flexible connector to reduce antenna loss from an antenna via the flexible connector to the main logic board. These apparatuses and techniques may be realized using one or more of the apparatuses shown in FIGS. 1-6 and installed as described with reference to the example method of FIG. 7. Thus, these figures illustrate only some of the many possible apparatuses or techniques.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Conclusion

Although implementations of apparatuses and techniques for providing a flexible connector between a secondary circuit board and a main logic board with a permeability shield to increase impedance of the flexible connector to reduce antenna loss from an antenna via the flexible connector to the main logic board have been described in language specific to certain features and/or methods, the subject of the appended claims is not necessarily limited to the specific features or methods described. Rather, the specific features and methods are disclosed as example implementations of systems and techniques for providing a flexible connector between a secondary circuit board and a main logic board with a permeability shield to increase impedance of the flexible connector to reduce antenna loss from an antenna via the flexible connector to the main logic board.

What is claimed is:

1. An apparatus comprising:
a secondary circuit board supporting one or more control pads and an antenna;
a flexible connector including a plurality of conductive traces configured to electrically couple the one or more control pads of the secondary circuit board to a coupling on a main logic board; and
a permeability shield configured to be disposed along one or more portions of the flexible connector, the permeability shield being configured to increase impedance of the flexible connector to reduce antenna loss of the antenna via the control pads and the flexible connector to the main logic board.

2. The apparatus of claim 1, wherein the permeability shield includes an electromagnetic compatibility (EMC) suppression film.

3. The apparatus of claim 2, wherein the EMC suppression film includes a polyimide film supporting or incorporating a high permeability material.

4. The apparatus of claim 3, wherein the EMC suppression film includes a self-adhesive EMC suppression tape.

5. The apparatus of claim 1, wherein the flexible connector includes a flat body having a first surface and an opposite second surface, and the permeability shield is disposed on one or both of the first surface and the second surface.

6. The apparatus of claim 1, wherein the secondary circuit board and the main logic board are received within an electronic device and the one or more portions of the flexible connector where the permeability shield is disposed are selected to avoid sections of the flexible connector where the flexible connector is configured to directly impinge upon surfaces of the main logic board or a housing of the electronic device.

7. The apparatus of claim 1, wherein the antenna includes a Bluetooth® antenna or a Wi-Fi™ antenna.

* * * * *